United States Patent [19]

Garcia et al.

[11] Patent Number: 4,691,724

[45] Date of Patent: Sep. 8, 1987

[54] ULTRASONIC DEVICE

[75] Inventors: Raoul Garcia, Paris; Daniel Michaux, Noisy-le-Sec; André Sales, Bures-sur-Yvette, all of France

[73] Assignee: SCP Biscornet, Paris, France

[21] Appl. No.: 790,614

[22] Filed: Oct. 23, 1985

[30] Foreign Application Priority Data

Oct. 23, 1984 [FR] France ............................... 84 16169

[51] Int. Cl.[4] ......................... B08B 9/00; H01L 41/04

[52] U.S. Cl. .................................... 134/169 R; 134/1; 134/184; 310/323; 310/325; 366/127

[58] Field of Search ................... 134/1, 169 R, 169 C, 134/184, 186; 68/3 SS; 366/120, 122, 127; 310/323, 325

[56] References Cited

U.S. PATENT DOCUMENTS

| | | | |
|---|---|---|---|
| 3,131,515 | 5/1964 | Mason | 310/325 X |
| 3,139,101 | 6/1964 | Wyczalek et al. | 134/186 |
| 3,173,034 | 3/1965 | Dickey et al. | 134/1 X |
| 3,331,589 | 7/1967 | Hammitt et al. | 310/325 X |
| 3,368,085 | 2/1968 | McMaster et al. | 310/325 |
| 3,394,274 | 7/1968 | Jacke et al. | 310/325 |
| 3,495,104 | 2/1970 | Burgo et al. | 310/325 |
| 3,524,085 | 8/1970 | Shoh | 310/325 |
| 4,173,725 | 11/1979 | Asai et al. | 310/325 |
| 4,615,984 | 10/1986 | Stoker | 134/184 X |

FOREIGN PATENT DOCUMENTS

| | | | |
|---|---|---|---|
| 668180 | 8/1965 | Belgium | 134/169 C |
| 719711 | 3/1980 | U.S.S.R. | 134/184 |

*Primary Examiner*—Philip R. Coe

*Attorney, Agent, or Firm*—Charles E. Brown; Charles A. Brown

[57] ABSTRACT

An ultrasonic device comprises at least one transducer and a probe having a first active part adapted to be immersed in a medium, an adapter part for matching the impedance of the probe to the medium and an end surface on the adapter part adapted to emit ultrasonic waves longitudinally into the medium. The first active part lies between the end surface on the adapter part, at which is located a peak of the longitudinal ultrasonic waves, and a limiting part at which is located a node of the longitudinal ultrasonic waves. It comprises a second active part adapted to emit ultrasonic waves radially into the medium and at which is located one or more peaks of the radial ultrasonic waves.

18 Claims, 13 Drawing Figures

24A
91
92
19
22
23
24
25
26
30
27A
27B
27
64
65
80
70
35
11
10
12
37
34
93
59
32
34A
36
34B
58
54
53
55
33
+1
1
0
-1

ULTRASONIC DEVICE

BACKGROUND OF THE INVENTION

1. Field of the invention

The present invention is generally concerned with the ultrasonic treatment of objects, surfaces or organisms, possibly making use of the phenomenon known as "ultrasonic cavitation".

2. Description of the prior art

As is known, and whatever the medium concerned, there is associated with a field of ultrasonic waves or vibrations a field of pressure waves which have a mechanical effect which can result in the destruction of micro-organisms, the mechanical vibration of particles and/or the instigation of resonance in particles, which can fragment or even destroy them.

In the case of a high intensity ultrasonic field in a liquid medium there occurs a phenomenon known as "cavitation" which results in destructive mechanical and chemical action with respect to micro-organisms. In the case of radioactive particles, the combination of these two actions can result in detachment of the particles and consequently in decontamination of the objects to which these radioactive particle were attached, subsequent to evacuation of such particles.

It is known that when a liquid is subjected to an alternating ultrasonic wave field the field causes variations in pressure within the liquid and so creates areas subjected alternately to decreases and increases of pressure. In an area of reduced pressure cavities are created and fill with gas. It is accepted that these cavities arise at microbubbles in suspension in the liquid or trapped at the surface of any kind of solid impurity. During successive phases of increased and reduced pressure brought about by the ultrasonic field, the diameters of these cavities or bubbles vary.

So-called vapor cavitation conditions are produced in the following way:

During the reduced pressure phase created by the ultrasonic wave the cavitation bubble grows to a maximum radius which may be in the order of 40 times the initial radius. In the subsequent increased pressure phase it is compressed and implodes suddenly, giving rise to numerous effects including:

the formation of a shock wave which propagates at a speed which may exceed that of sound in the liquid, creating in the vicinity very high pressure and temperature fields;

the occurrence of sonoluminescence;

the formation of particularly active ions ($OH^-$ and $H^+$), releasing oxygen molecules and forming oxygenated water.

At the implosion sites gas bubbles form on the next cycle during the pressure reduction and the process resumes. Thus generations of bubbles vary in volume at the same point at a rate determined by the ultrasonic wave, giving rise to cavitation very quickly. Cavitation manifests itself by a characteristic whistling sound and a cloud of bubbles.

By virtue of the formation at the ultrasonic frequency used by turbulence associated with very high pressure and temperature fields, ultrasonic cavitation has a particularly intense eroding effect on surfaces disposed in the immediate vicinity of the cavitation area, and is consequently highly effective for cleaning such surfaces.

The mechanical and chemical phenomena mentioned hereinabove result in the destruction of bacteria that may be attached to the surfaces to be cleaned. Thus it is possible to consider ultrasonic cavitation as a means of cleaning and/or sterilizing surfaces.

The same applies in the case of radioactive deposits of dirt such as may be found on surfaces to be decontaminated such as those of nuclear reactor pools or within pipes in nuclear power plants. The mechanical and chemical phenomena to which the contaminated particles are subjected necessarily detach them from their support which, following evacuation of the particles, is decontaminated.

In the context of the present invention, the concept of cleaning is to be understood as encompassing that of decontamination. When the surfaces or objects to be cleaned are of significant dimensions, the effectiveness of a cleaning device of this kind is related to the volume of the liquid into which ultrasound can be injected, however. The problem of the quantity of energy available may then arise.

The present invention concerns a device for injecting ultrasound into a solid, liquid or gaseous medium which features especially high efficiency and energy dispersion capability. The present invention also concerns cleaning apparatus and installations employing this device.

There have previously been developed ultrasonic devices, more specifically for liquid media, which comprise at least one ultrasonic transducer, which is generally a piezo-electric (usually called "ceramic") cell, and at least one probe of which a so-called "active" or "cavitation" part is immersed in said medium and comprises a part for matching the impedance to said medium with an end face from which longitudinal ultrasonic waves are emitted. As a general rule, these devices comprise one or more conversion members, namely a "quarter-wavelength section" and one or more "sonotrodes". The impedance adapter consists of a set of such sonotrodes, which are members having a length equal to a multiple of half the wavelength in the material of which they are made at the excitation frequency and the cross-section of which varies, generally according to some form of hyperbolic function, constant or decreasing in the primary wave propagation direction. The sonotrodes multiply the amplitude of the vibrations at the frequency in question by the ratio of their inlet to outlet surface area.

Although the efficiency of an ultrasonic device of this kind is satisfactory in certain applications, it is relatively often insufficient in other applications requiring a considerable dispersion of energy. Energy is supplied to the medium only from the end surface which, given the characteristic shape of the terminal part of the impedance adapted, usually that of an inverted horn, is relatively limited.

In this type of implementation there is a lack of energy available for emission in the form of longitudinal vibrations and, whatever else may be the case, inadequate effectiveness when only these longitudinal vibrations are used.

Also known in the prior art are so-called ultrasonic tanks. These tanks are filled with a liquid, generally water to which a detergent has been added. The objects to be cleaned are then totally immersed in the tank. The water is subjected to an ultrasonic field by means of an ultrasonic device, of substantially the same type as that briefly described hereinabove, attached to the bottom of the tank. Cavitation arises in the liquid within the tank.

This type of tank generally proves satisfactory but its capabilities are limited by its internal dimensions, with the result that certain bulky objects cannot be cleaned in this way.

There are also known dental probes that the dentist holds in his hand. These probes provide for the emission of a relativly fine jet of liquid which is subjected to an ultrasonic field. Although it is well adapted to the problem of dental surgery, this technology may be difficult to extrapolate to the cleaning of large industrial objects. Generally speaking, this technique is characterized by a particularly low efficiency. Also, industrial objects to be cleaned are, as has already been said, often relatively bulky, which makes it difficult to extrapolate and adapt these dental probes.

An objective of the present invention is to propose an ultrasonic device offering particuarly high efficiency and providing for a high degree of energy dispersion whatever the medium excited by means of the ultrasonic field.

Another objective of the present invention is to propose various forms of cleaning apparatus and installation providing in particular for cleaning industrial objects of particularly large size and hollow objects the space inside which is accessible only with difficulty. Another application of the ultrasonic device in accordance with the present invention consists in apparatus and installations for cleaning surfaces such as tunnels, hospital rooms or nuclear reactor pools in electric power plants.

SUMMARY OF THE INVENTION

In one aspect, the present invention consists in an ultrasonic device comprising at least one transducer and a probe having a first active part adapted to be immersed in a medium, an adapter part for matching the impedance of said probe to said medium and an end surface on said adapter part adapted to emit ultrasonic waves longitudinally into said medium, wherein said first active part lies between said end surface on said adapter part, at which is located a peak of said longitudinal ultrasonic waves, and a limiting part of which is located a node of said longitudinal ultrasonic wavse and comprises a second active part adapted to emit ultrasonic waves radially into said medium and at which is located one or more peaks of said radial ultrasonic waves.

The present invention achieves its objectives by virtue of these arrangements, particularly that of proposing an ultrasonic device, more specifically for liquid media, the efficiency and the power dissipation capability of which are significantly increased as compared with the ultrasonic devices described hereinabove.

In these devices only the emitting surface at the end of the probe, at which is located a peak of the longitudinal ultrasonic waves, constitutes the interface surface between the device and the medium.

In the device in accordance with the present invention the interface surfaces with the medium are multiple and consist in the end surface at which is located a peak of the longitudinal waves and the portion or portions on said second active part at which is located a peak of said radial ultrasonic waves.

Another objective of the invention is the cleaning and/or decontamination of industrial objects and/or surfaces by applying ultrasound to a body of liquid, by virtue of the resulting cavitation.

We have had to consider the problems of cleaning hollow objects the space inside which is particularly difficult of access. More specifically, we have been faced with the problem of cleaning and decontaminating the inside surfaces of valves and other pipework components in nuclear power plants.

There is already known from U.S. Pat. No. 3,173,034 a process for cleaning the internal combustion chamber of an engine by applying ultrasound to a quantity of liquid introduced into the chamber, using a probe emitting an ultrasonic signal fixed to a support itself screwed in instead of the sparkplug.

In theory this technique should prove satisfactory if adapted to cleaning pipework components such as valves. However, the levels of ultrasonic energy to be deployed are too high for the known ultrasonic devices, the structure of which is described above, to be used.

Thus another objective of the present invention is to propose apparatus for cleaning hollow objects such as valves or pipework components by applying ultrasound to a liquid confined within the object, featuring high efficiency and a high level of power transmission capability.

In another aspect, the present invention consists in apparatus for cleaning hollow objects which comprise a main orifice and are adapted to contain a liquid, said apparatus comprising a support adapted to carry at least one ultrasonic device comprising at least one transducer and a probe having a first active part adapted to be immersed in a medium, an adapter part for matching the impedance of said probe to said medium and an end surface on said adapter part adapted to emit ultrasonic waves longitudinally into said medium, wherein said first active part lies between said end surface on said adapter part, at which is located a peak of said longitudinal ultrasonic waves, and a limiting part at which is located a node of said longitudinal ultrasonic waves and comprises a second active part adapted to emit ultrasonic waves radially into said medium and at which is located one or more peaks of said radial ultrasonic waves, the arrangement being such that, in use, said first active part of said device is immersed in said liquid contained in one of said objects.

By virtue of this arrangement, and in particular by virtue of the use of the ultrasonic device in accordance with the present invention, it is possible to apply ultrasound to a significant quantity of liquid and thus to clean the inside surfaces of objects having a particularly large volume, such as valves in the pipework of nuclear power plants, for example. In this connection, the reader is reminded that such valves routinely have diameters of the order of several tens of centimeters, so that the internal volume can be as much as one cubic meter, which gives an idea of the volume into which ultrasound is to be fed. The ultrasonic device in accordance with the present invention and the apparatus with which it is associated make it possible to apply ultrasound to such volumes and so to clean the inside surfaces of the valves in question.

Another problem with which we have been faced is that of cleaning and decontaminating large surfaces, such as those of reactor pools in nuclear power plants, for example, railroad and road tunnels and even hospital rooms.

There is known specifically from UK Patent No 1 282 552 a device for cleaning surfaces by confining a body of liquid in contact with the surface and producing cavitation in this volume.

Once again, until now this technique has proved satisfactory from the theoretical point of view or when applied to relatively small surfaces. The ultrasonic devices that could be considered for this use, and especially those described hereinabove, provided only for applying ultrasound to a relatively restricted volume of liquid, so reducing the cleaning capacity of devices such as that described in the aforementioned UK patent.

A further objective of the present invention is thus to propose apparatus for cleaning surface featuring high efficiency and providing for the effective cleaning of especially large surfaces.

In a further aspect, the present invention consists in apparatus for cleaning surfaces, comprising a chamber adapted to contain a liquid and having an opening adapted to be directed towards a surface to be cleaned and at least one ultrasonic device comprising at least one transducer and a probe having a first active part adapted to be immersed in a medium, an adapter part for matching the impedance of said probe to said medium and an end surface on said adapter part adapted to emit ultrasonic waves longitudinally into said medium, wherein said first active part lies between said end surface on said adapter part, at which is located a peak of said longitudinal ultrasonic waves, and a limiting part at which is located a node of said longitudinal ultrasonic waves and comprises a second active part adapted to emit ultrasonic waves radially into said medium and at which is located one or more peaks of said radial ultrasonic waves, the arrangement being such that, in use, said first active part of said device is immersed in said liquid.

By virtue of this arrangement it is possible to apply ultrasound to a significant volume of liquid and consequently to propose cleaning apparatus featuring a large area of liquid in contact with the surface to be cleaned and subjected to ultrasonic vibration.

The effect of this is to permit especially large surfaces to be cleaned with high efficiency.

Other objects and advantages will appear from the following description of examples of the invention, when considered in connection with the accompanying drawings, and the novel features will be particularly pointed out in the appended claims.

DESCRIPTION OF THE PREFERRED EMBODIMENTS

Figures 1, 1A, 1B:
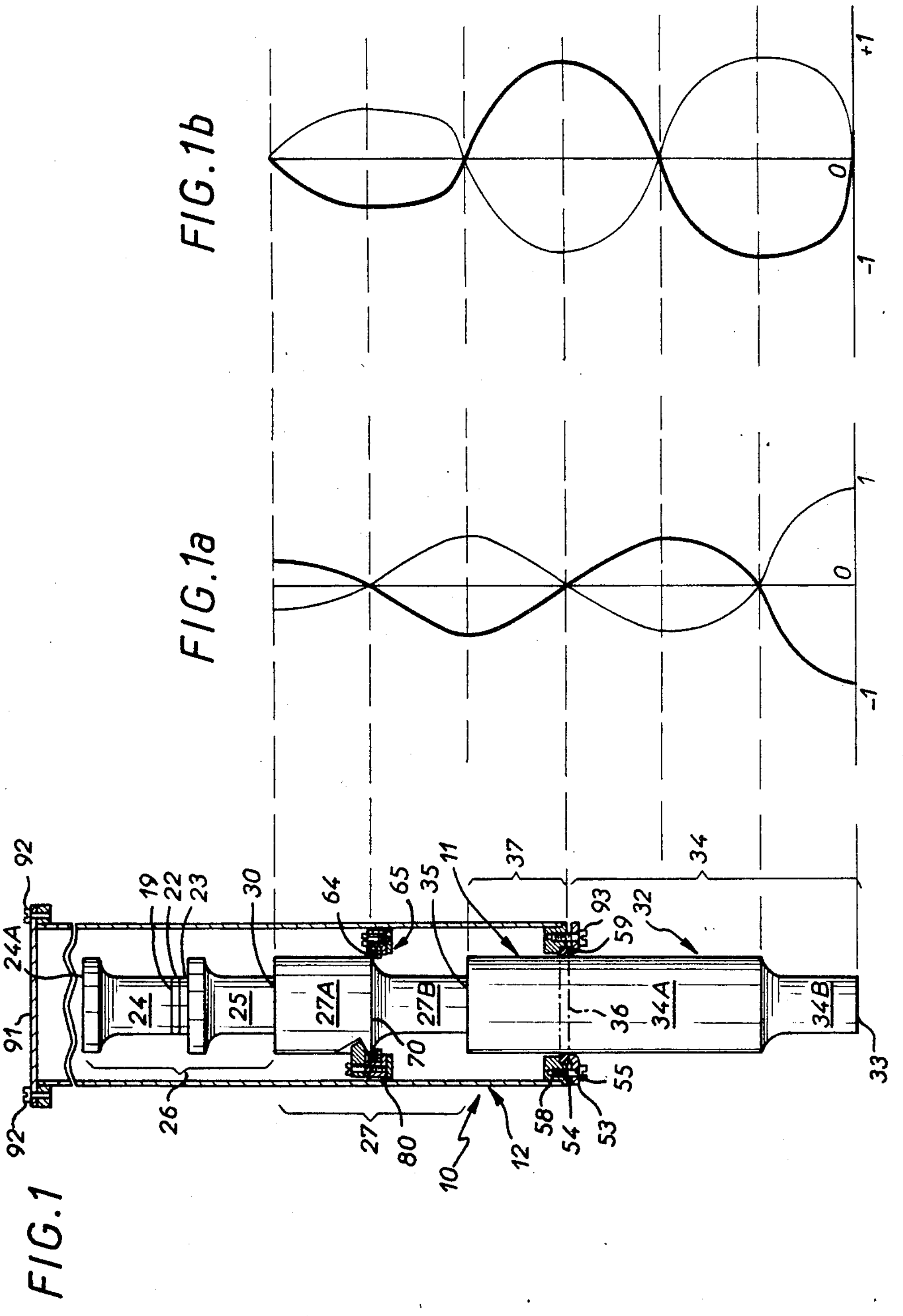
FIG. 1 shows one embodiment of an ultrasonic device in accordance with the present invention in axial cross-section.
FIGS. 1*a* and 1*b* are diagrams showing the amplitude of longitudinal and radial vibrations, respectively.

In the selected embodiment shown in FIG. 1, ultrasonic cleaning apparatus 10 comprises an ultrasonic device 11 mounted in a protective housing 12. In this embodiment, the ultrasonic device 11 comprises two peizo-electric ceramic members 22, 23 sandwiched between a so-called "rear" mass 24 and a "quarter-wavelength" section acoustic impedance adapter 25 the axial dimension of which is equal to one quarter of the ultrasonic wavelength in the material in question.

It will be seen that the rear mass 24 and the quarter-wavelength section 25 in this embodiment feature a reduction in cross-section, from an upper portion of the parts 24 and 25 to a respective end portion 19 and 30, the surface of which is in contact with the next part. In the case of the quarter-wavelength section 25, this reduction is in order to constitute an amplitude converter, the amplitude of the vibrations at the outlet surface 30 being equal to the product of that at the inlet surface and the ratio of these two surface areas, reduced by losses inherent to propagation in the material.

These arrangements implement impedance matching to optimize the efficiency of the combination.

The surface 30 is in contact with a unitary construction median part of "sonotrode" 27, the length of which is equal to one half wavelength in the material in question. This sonotrode in turn comprises two different portions, namely a cylindrical first portion 27A, the length of which is equal to one quarterwavelength, followed by a second portion 27B of the same length featuring a reduction in cross-section. This sonotrode part 27 is used to increase the amplitude of the vibrations, and contributes to the impedance matching function. The sonotrode 27 is in contact with a probe 32 through a common contact surface 35.

Generally speaking, the probe 32 comprises a so-called "active" part 34 immersed in the medium to which ultrasound is to be applied and an internal part 37.

In this example the medium to which ultrasound is to be applied is a liquid, in this instance water which may or may not have detergent added to it: the active part is then referred to as a "cavitator".

The total axial length of the probe 32 between its end surface 33 and its inside contact surface 35 is in this case two half-wavelengths. This length must be such that the total length separating the end surface 33 from the contact surface 30 is equal to a multiple of the half-wavelength at the frequency in question in the material constituting the ultrasonic device 11. A part 34B immediately preceding said end surface 33 of the cavitator also features a cross-section reduction of one quarter-wavelength to increase the amplitude and to match the impedance to the medium to which ultrasound is to be applied, in this instance water to which detergent may or may not be added. It will be seen that the upper part 34A of the cavitator is cylindrical, as is the inside part 37.

Before proceeding with the description of the ultrasonic device 11, the operation of the structure which has just been described will be briefly explained.

The two piezo-electric ceramic members 22, 23 are coupled to an ultrasonic generator (not shown) the operating frequency of which is in this instance 20,000 Hz. The electrical signal energizes these ceramic transducers which generate mechanical vibrations at the same frequency which propagate throughout the device 11. These vibrations are reflected by the rear surface 24A of the rear mass 24 and by the end surface 33.

The mechanical vibrations generated by the piezo-electric cell 22, 23 are longitudinal vibrations since the ceramic members function in axial compression.

The multiple reflections at the aforementioned ends 24A and 33 of the ultrasonic device create a standing vibration field. It thereby creates along the length of the head vibration modes comprising nodes and peaks.

FIG. 1*a* plots the amplitude of the longitudinal vibrations as a function of the distance from the surface constituted by the ceramic members 22, 23. There is thus observed a distribution of the nodes (points of zero amplitude) and peaks (points of maximum relative amplitude) along the ultrasonic device 11 shown from the contact surface 30 between the quarter-wavelength section 25 and the median part 27.

It will also be seen that the size of the various components 24, 25, 27 and 32 is such that at the end surface 33 there is located a peak of the longitudinal vibrations.

We have discovered that radial vibrations associated with the longitudinal vibrations make it possible to increase the effectivenss of the probe to a surprising degree.

FIG. 1*b* shows the amplitude of the radial vibrations as a function of the distance from the source. There is again observed a distribution of nodes and peaks for the radial vibration mode.

In accordance with the invention, the active part or cavitator 34 of the probe 32 extends axially between the end surface 33, at which there is located a peak of the longitudinal vibration mode, and a limit part 36 in this case separating the active part 34 from the inside part 37 of the probe 32, there being located at this limiting part 36 a node of the longitudinal vibration mode; it comprises a second or radial active part, in this case the upper part 34A on the cavitator 34, at which is located at least one peak of radial vibration.

In the embodiment shown, there is only one peak of radial vibration at the upper part 34A. In other embodiments this radial active portion may have a greater axial length in order to feature a number of immersed radial vibration peaks.

This length is advantageously n·λ/2 where n is an integer and λ is the wavelength. The length of the active part is then (2n+1)·λ/4.

The ultrasonic device is in this instance made from titanium, the wavelength in this metal at a frequency of 20 kHz being of the order of 33 cm. The length of the head shown in FIG. 1 is thus approximately 70 cm and its diameter 6 cm.

It will be noted that titanium features low internal transmission losses and high resistance to fatigue caused by the vibrations that pass through it.

The means fastening the ultrasonic device 11 to the inside of the housing 12 will now be described.

According to one aspect of the invention, the means for fasteneing the ultrasonic device 11 to the housing are disposed so as to act on at least one portion of the ultrasonic device at which is located a node of the longitudinal vibrations.

In the embodiment shown and in accordance with another aspect of the present invention, said fastening means comprise at least one damper seal.

In the example shown in FIG. 1, the probe 32 is fastened to the housing 12 through the intermediary of an annular base damper seal 59 which acts on the probe 32 at the level of the limiting part 36, at which is located a node of the longitudinal vibrations, which thus serves as a fixing part.

The base damper seal 59 is clamped between an annular seal-carrier member 58 comprising a groove intended to partially accommodate the seal 59, this part being fastened to the housing 12, and a closing ring 53 which clamps to the seal-carrier part 58.

The seal-carrier part 58 comprises threaded holes 54 to provide for clamping up by means of fixing screws 93 passing through orifices 55 formed in the ring 53. Thus the seal 59 is immobilized by compression in a position of radial clamping of the probe 32 and thus provides a seal between the liquid medium to which ultrasound is to be applied and the inside of the housing 12.

In the embodiment shown, the fastening means comprise an intermediate annular damper seal 64 which acts on the median part 27.

In accordance with the present invention, this seal bears on the junction 70 between the restriction 27B and the cylindrical part 27A, this junction being the location of a node of the longitudinal vibrations (see FIGS. 1 and 1*a*).

To this end the seal 64 features in radial cross-section (FIG. 1*c*) a notch 69 the shape of which is complementary to that of the junction 70 between the parts 27A and 27B, so that the seal 64 contributes to supporting the median part 27 and thus the device 11 as a whole.

The seal 64 is mounted in an annular support structure generally referenced 65 which comprises a seal carrier ring 66 on which retaining pegs 73 are mounted and a so-called "compression" ring 67.

The seal-carrier ring 66 comprises a set of holes: threaded holes 76 and unthreaded holes 96.

Figure 1C:
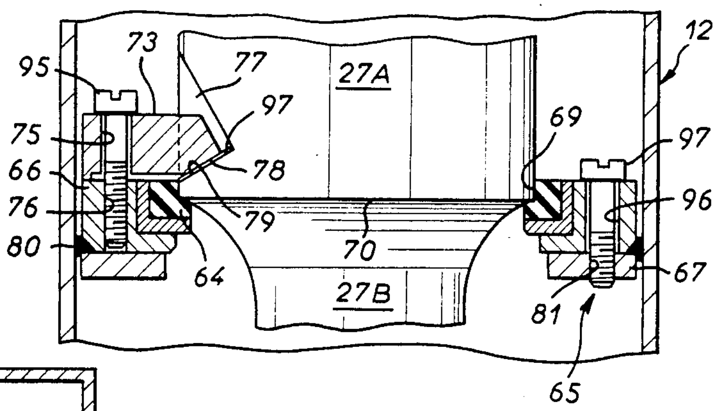
FIG. 1*c* is a view to a larger scale of a detail of FIG. 1.

The retaining peg 73, of which there are four in this embodiment, only one of them being shown in FIGS. 1 and 1*c*, feature a hole 75 and are fixed to the seal-carrier ring 66 by screws 95 threaded into the threads 76.

The pegs 73 penetrate into milled notches 77 on the median part 27, each of these pegs having a retaining surface 78 which bears agains a corresponding bearing surface 79 of the notch 77. A thin gasket 97 is disposed between the two surfaces 78 and 79.

The compression ring 67 features threaded holes 81. Screws 97 pass through the holes 96 and are screwed into the threaded holes 81.

In accordance with one aspect of the present invention, the support structure assembly 65 is retained axially by a retaining damper-seal 80 compressed between the rings 66 and 67. The retaining damper-seal 80 is in this instance in the form of an O-ring.

A closure plate 91 is mounted at the upper end of the housing 12 by means of screws 92.

The ultrasonic device 11 is mounted in the housing 12 as follows:

The seal-carrier ring 66 with the intermediate damper-seal 64 is first mounted on the junction 70 between the restriction 27B and the cylindrical part 27A of the median part 27. The retaining pegs 73 are then screwed up, with the gaskets 97 inserted between the retaining surfaces 78 of the peg and the bearing surface 79 of the notches 77.

The assembly is then positioned within the housing 12, into which it is inserted from the top end, so that only the cavitator 34 passes outside it and so that the limit part 36 faces the location of the first damper-seal 59.

The O-ring 80 is then fitted and compressed by the compression ring 67 when the screws 97 are tightened down.

Axial compression of the damper O-ring 80 causes radial compression of the O-ring 80 against the inside wall of the housing 12 and secures by friction axial retention of the ultrasonic device 11 as a whole and of the annular structure 65 in the housing 12.

The damper-seal 59 is then placed in the groove in the seal-carrier part 58 and this seal 59 is compressed by means of the screws 93.

Once again, axial compression of this damper-seal 59 causes radial expansion thereof as a consequence of which radial pressure is applied against the seal-carrier part 58 and against the limit part 36 of the probe 32.

It will be noted that this arrangement employing a number of damper-seals provides for axial retention of the ultrasonic device, in particular by virtue of radial expansion of the O-ring 80 and the amper-seal 59, whilst filtering, by virtue of the resilience of these seals, the mechanical vibrations the frequency of which (20 kHz in this example) is significantly higher than the cut-off frequency of elastic materials as normally used to manufacture such seals.

It will also be noted that the positioning of the base damper-seal 59 and the intermediate damper-seal 64 on portions of the ultrasonic device at which are located a node of the longitudinal vibrations (see FIGS. 1 and 1*a*) means that these seals function only in radial compression-expansion, providing a good friction grip on the ultrasonic device and avoiding axial displacements which could eventually lead to wear due to shearing effects. On the other hand, the radial vibrations do not present any significant disadvantage since the seals function in the direction of their natural resilience.

In this embodiment, this applies particularly to the base seal 59 which has a two-fold function: axial retention of the device 11 and sealing. By avoiding premature wear due to shearing, the necessary long-term seal is achieved.

Figure 2:
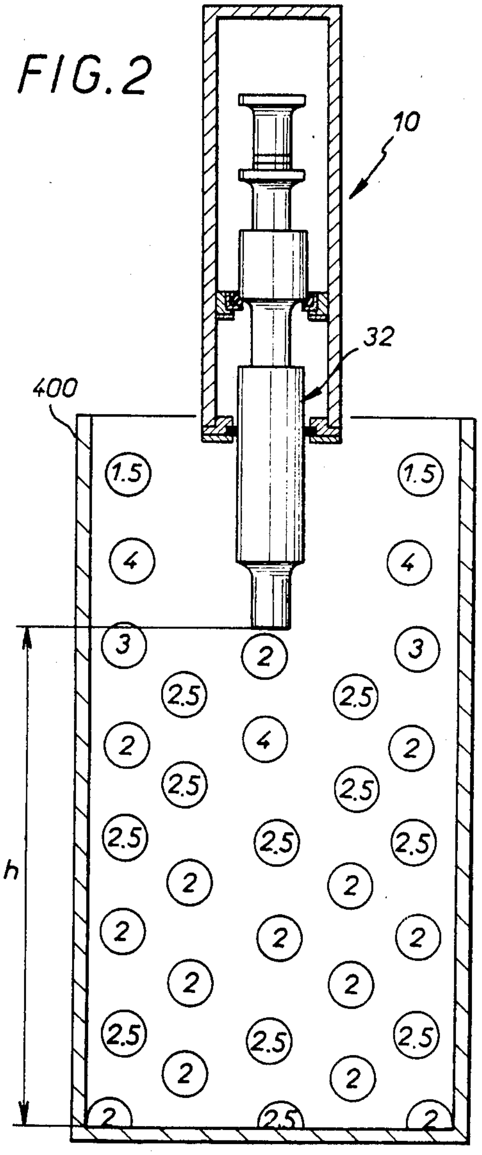
FIG. 2 is a schematic diagram showing the distribution of the pressure variation field in a liquid medium to which ultrasound is applied by an ultrasonic device in accordance with the present invention.

FIG. 2 shows the variation in the pressure field in a beaker filled with water after insertion and energization of the ultrasonic apparatus 10 in accordance with the present invention.

In this connection the reader is reminded that energization of a 20 kHz ultrasonic generator (not shown in the figures) connected to the piezo-electric ceramic members of the ultrasound apparatus 10 subjects the liquid, through the intermediary of the cavitator 34 in particular, to an alternating ultrasound field which causes pressure variations within the liquid: when the power employed is sufficient, in this example approximately 300 W, there is produced a cavitation phenomenon under so-called vapor cavitation conditions as briefly described hereinabove.

It should be noted that, generally speaking, the erosion quality of a medium to which ultrasound is applied depends on the average value of the pressure field: the higher this value, the higher the erosion quality of the medium and, consequently, the more effective the cleaning of objects in contact with this medium.

The values indicated in the circles shown in FIG. 2 represent the values of pressure measured at various points relative to the initial average pressure of the liquid before energization of the ultrasound apparatus 10.

It will be noted that the average value of the pressure field is particularly high since numerous measured points show a value equal to two and a half times the initial pressure or more.

These pressure values have been achieved notably by virtue of the radial active part 34A, at which a peak of radial vibrations is located. The surface area of this radial action part 34A is large, favoring the emission of radial vibrations.

By way of comparison, we have carried out tests in a cylindrical beaker 400 of the same diameter as that used previously with ultrasound apparatus 401 having a structure identical to that of the ultrasound apparatus 10, namely the rear mass, the piezoelectric ceramic members, the quarter-wavelength section and the median part. Only the probes 32 is different, having been replaced by a probe 402 the restriction 402B in which is identical to the restriction 34B in the cavitator 34 in accordance with the present invention. On the other hand, the probe 402 does not feature any radial active part. This probe 402 is thus representative of the probes previously developed by us.

The ultrasound apparatus 401 has been disposed so that the end surface 433 of the probe 402 is at the same distance h from the bottom of the beaker as the end surface 33 of the probe 32 in FIG. 2. Thus the same "useful" volume of liquid is subjected to ultrasound in both cases: this is the volume between the end surfaces and the bottom of the beaker.

Figure 3:
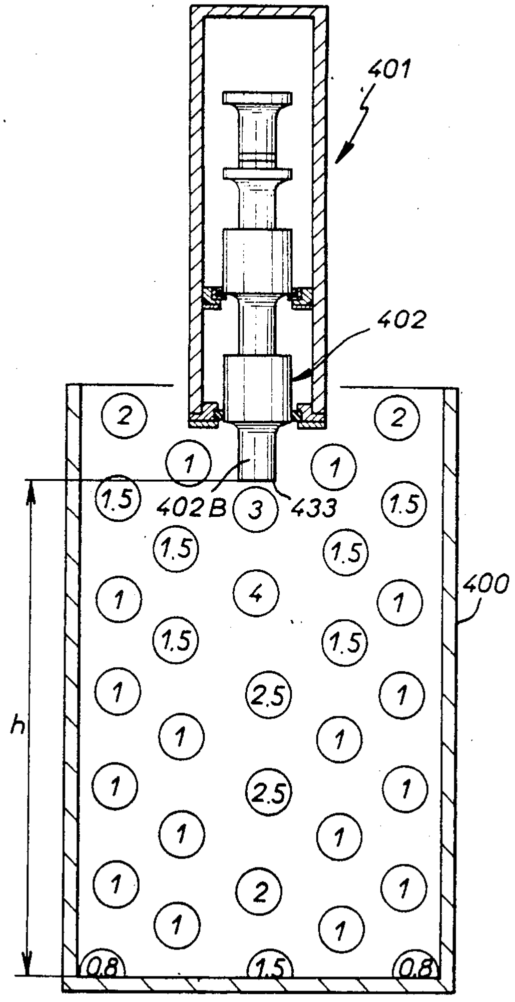
FIG. 3 PRIOR ART
FIG. 3 is a view corresponding to FIG. 2 but showing the distribution of the pressure variation field in the volume of liquid to which ultrasound is applied by an ultrasonic device of the prior art.

Values of the pressure field were measured under the same conditions as is the case in FIG. 2 and are shown in FIG. 3.

It is seen that vertically beneath the end surface 433 of the probe 402 the measured field values are fairly comparable with those measured vertically below the end surface 33 (FIG. 2).

In both cases the pressure variation field is induced by the longitudinal vibrations emitted by the end surface 33 or 433. As, in the context of this comparison, the powers employed are the same, it is normal that the pressure field induced by the longitudinal vibrations present in both cases should have substantially the same value.

On the other hand, in the remainder of the volume of the liquid to which ultrasound is applied by the probe 402, the value of the average pressure field remains near the initial pressure prior to cavitation since there are observed numerous values equal to unity.

Thus the presence in accordance with the invention in the cavitator 34 of a radial action part 34A, emitting radial vibrations, confers a decisive advantage relative to the probe 402, representative of prior art probes since the average value of the induced pressure field is notably higher, other things being equal.

There will now be described with reference to FIGS. 4 through 7 an application of an ultrasonic device in accordance with the invention to the cleaning of hollow objects.

Figure 4:
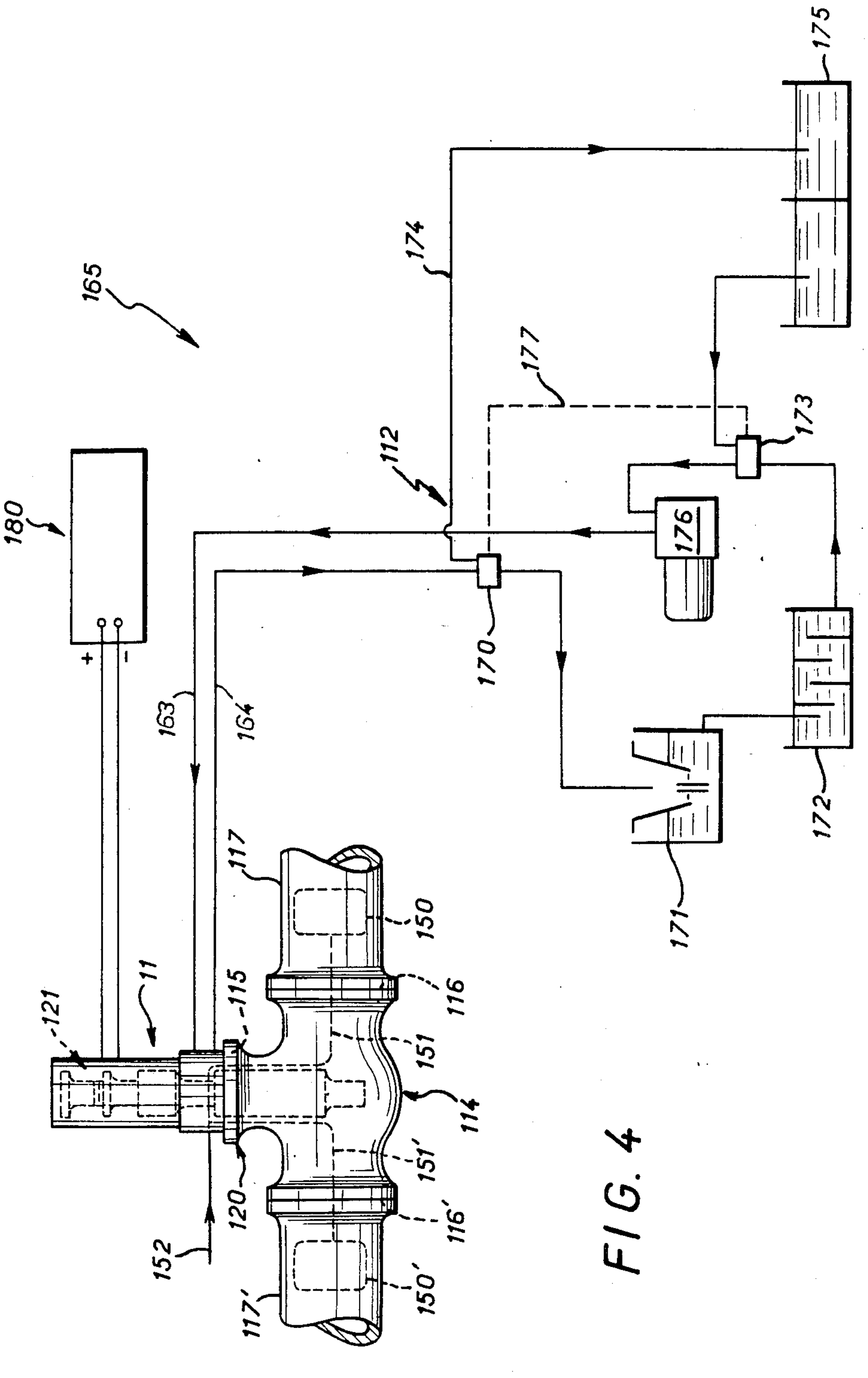
FIG. 4 is a schematic showing an installation in accordance with the present invention for cleaning hollow objects.
Figure 5:
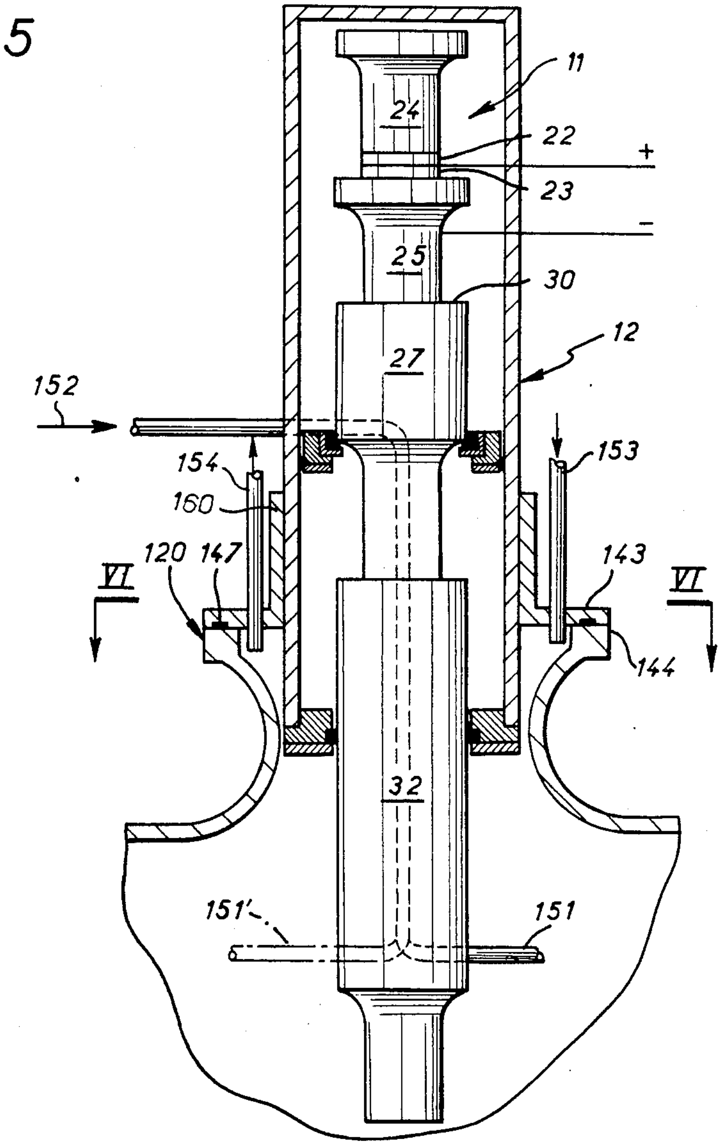
FIG. 5 is a schematic partial cross-section to a larger scale of the cleaning apparatus of the installation shown in FIG. 4.
Figure 6:
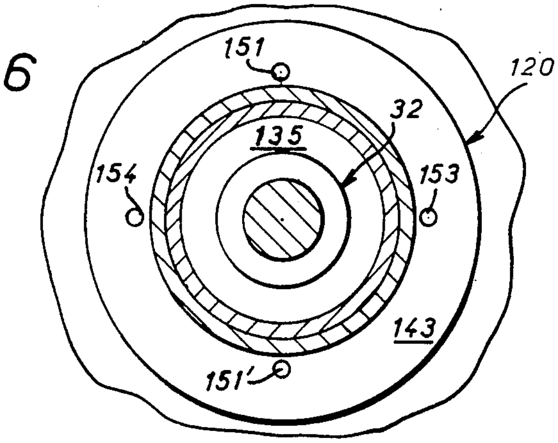
FIG. 6 is a view of the support for the apparatus of FIG. 5 in cross-section on the line VI—VI in FIG. 5.

FIGS. 4 through 6 show more particularly the application of an ultrasonic device to cleaning the inside of the body of a valve 114.

In accordance with this aspect of the present invention, a volume of cleaning liquid is confined within the body of the valve, by first closing off in fluid-tight manner the various conduits leading to it, in this instance the pipes 117, 117′, leaving only one orifice which is then called the "main" orifice and is available for the ultrasonic device. Generally speaking, in the case of valves and especially those used in nuclear electric power plants, it is possible to gain access to the inside of the "body" of the valve in situ after removing the part of the valve called the "bonnet" comprising in particular the obturator: in this way there is exposed a main orifice 120 through which are inserted said means for closing off the inlet and outlet orifices of the valve, described hereinafter, and an ultrasonic device in accordance with the present invention.

The ultrasonic device generally referenced 11 in FIGS. 4 and 5 is mounted in a housing generally referenced 12 in these figures. These two components and the means joining them are similar to those described with reference to FIGS. 1 and 2, carry the same references in FIGS. 4 and 5 and are not described again.

The housing 12 of the ultrasonic device 11 is mounted on a support 143 featuring a cylindrical collar 160 is which the housing 12 is force fitted.

The diameter of this annular support 143 is similar to that of the head of the valve 114 featuring the main orifice 120 and is adapted, by means of a seal 147, to close off this main orifice 120. The support 143 features four axial pegs (not shown in FIGS. 4 and 5) by means of which it is centered in the orifice 120.

It will be seen in FIG. 5 that the combination of the support 143 and the housing 12 is arranged so that the cavitator 34 of the ultrasonic device 11 is immersed inside the body of the valve 114.

There will now be described the means for closing off secondary orifices which, in accordance with this aspect of the present invention, are associated with the ultrasonic device 11.

In this embodiment, these closing off means comprise pneumatic buffers 150, 150′ implemented as airbags inserted into the pipe sections 117, 117′ beyond the orifices 116, 116′ of the valve 114 to which these pipe sections 117, 117′ are connected. The airbags 150, 150′ are inflated by the air circuit schematically represented in FIG. 4 by the conduits 151, 151′ connected to a compressed air supply schematically represented by the arrow 152.

In FIG. 5 the conduit 151 is shown in full line whereas the conduit 151′, which lies in front of the cross-section plane, is shown in chain-dotted line.

In the selected embodiment shown in these figures, the cleaning apparatus consisting of the ultrasonic device 11, the housing 12, the support 143 and the closing off means 150, 150′, 151, 151′ comprises a cleaning liquid inlet conduit 153 and a cleaning liquid outlet conduit 154, respectively connected to conduits 163, 164 of a cleaning liquid circuit 165 (FIG. 4).

The cleaning liquid circuit 165 here comprises a cleaning solution filter 170 connected to the liquid outlet conduit 164 from the cleaning apparatus. On its outlet side the filter is connected to a centrifuge 171 enabling solid particles to be separated from the remainder of the solution. The liquid outlet from this centrifuge is connected to a tank 172 of cleaning solution itself connected to a mixer 173. The filter 170 has a water outlet connected to a conduit 174 itself connected to a water tank 175. The outlet from this water tank 175 is connected to the inlet to the mixer 173 the outlet from which is connected to a pump 176 discharging into the conduit 163 through which liquid reaches the cleaning apparatus.

In another embodiment the filter 170 may comprise a second water outlet which is connected directly to the mixer 173, this connection being schematically represented by a dashed line 177.

It will be noted that an ultrasound generator-amplifier 180 is connected to the ultrasonic device 26. More specifically, a "+" terminal is connected the piezo-electric ceramic members 22, 23 and an earth "−" terminal is connected to the quarter-wavelength section 25. This generator operates at a frequency of 20 kHz.

The operation of the cleaning apparatus shown in FIGS. 4 and 5 will now be described.

As in this example the hollow object to be cleaned is the body of the valve 114, comprising two secondary orifices 116 and 116′ connected to the pipes 117, 117′, the first operation consists in inserting the airbag pnematic buffers 150, 150′ into said body. The support 143 with the ultrasonic device 11 is then atached over the orifice 120. The latter is thus closed off.

The conduits 151, 151′ are then connected to the compressed air supply 152 and the cleaning liquid inlet and outlet conduits 153, 154 are connected to the corresponding conduits 163, 164 of the cleaning liquid circuit 65.

The airbags 150, 150′ are then inflated. When they are partially inflated, cleaning liquid is admitted into the interior of the valve 114. The pressure of this cleaning liquid on the airbags 150, 150′ then contributes to the positioning thereof in the conduits 117, 117′ beyond the secondary orifices 116, 116′ of the valve 114. Inflation of these airbags must then be completed so that the interior of the valve 114 is hermetically sealed.

The ultrasound head 26 may then be energized by an ultrasonic wave emitted by the generator-amplifier 180. An ultrasound field is then established within the valve 114, bringing about vapor cavitation characterized by the creation and implosion of bubbles at a rate set by the ultrasound field frequency.

These bubbles fill the major part of the interior of the body of the valve 114. The implosion of the bubbles which come into contact with the inside surface of said body provide for tearing away patches of deposited dirt. The multiplication of these implosions at the ultrasound field frequency means that the inside surface of the body of the valve 114 is rapidly cleaned.

In the selected example shown, the current of liquid produced by the pump 176 makes is possible to evacuate via the circuit 165 the detached patches of deposited dirt. The installation shown in FIG. 1 operates in a closed circuit. The filter 170 makes it possible to separate as much as possible the cleaning solution from the cleaning water on the downstream side of the outlet conduit 154. The cleaning solution, charged with particles of dirt, is then fed into the centrifuge 171, the function of which is to separate out the dirt particles by centrifugal force, a relatively pure solution being recovered from the centrifuge and returned to the solution tank. The outlet from the solution tank and that from the water tank 175 lead to a mixer 173. The liquid is fed from the mixer outlet to the inlet circuit 163 through the pump 176.

It has already been pointed out that the axial size of the ultrasonic device is dependent on the wavelength in the metal. The reader is reminded that the device 11 is made of titanium and is designed to function at 20 kHz, as a consequence of which its axial length is approximately 70 cm. An ultrasonic device of this kind, which has a diameter of 6 cm, is particularly well adapted to cleaning valves having orifices more than 15 cm in diameter, like those shown in FIG. 4.

On the other hand, for valves having orifices of smaller diameter, it is necessary to reduce the size of the device 11 and therefore to operate at a higher frequency. Thus for valves having orifices less than 15 cm in diameter, use may advantageously be made of a device approximately 35 cm high and 4 cm in diameter functioning at 40 kHz.

Figure 7:
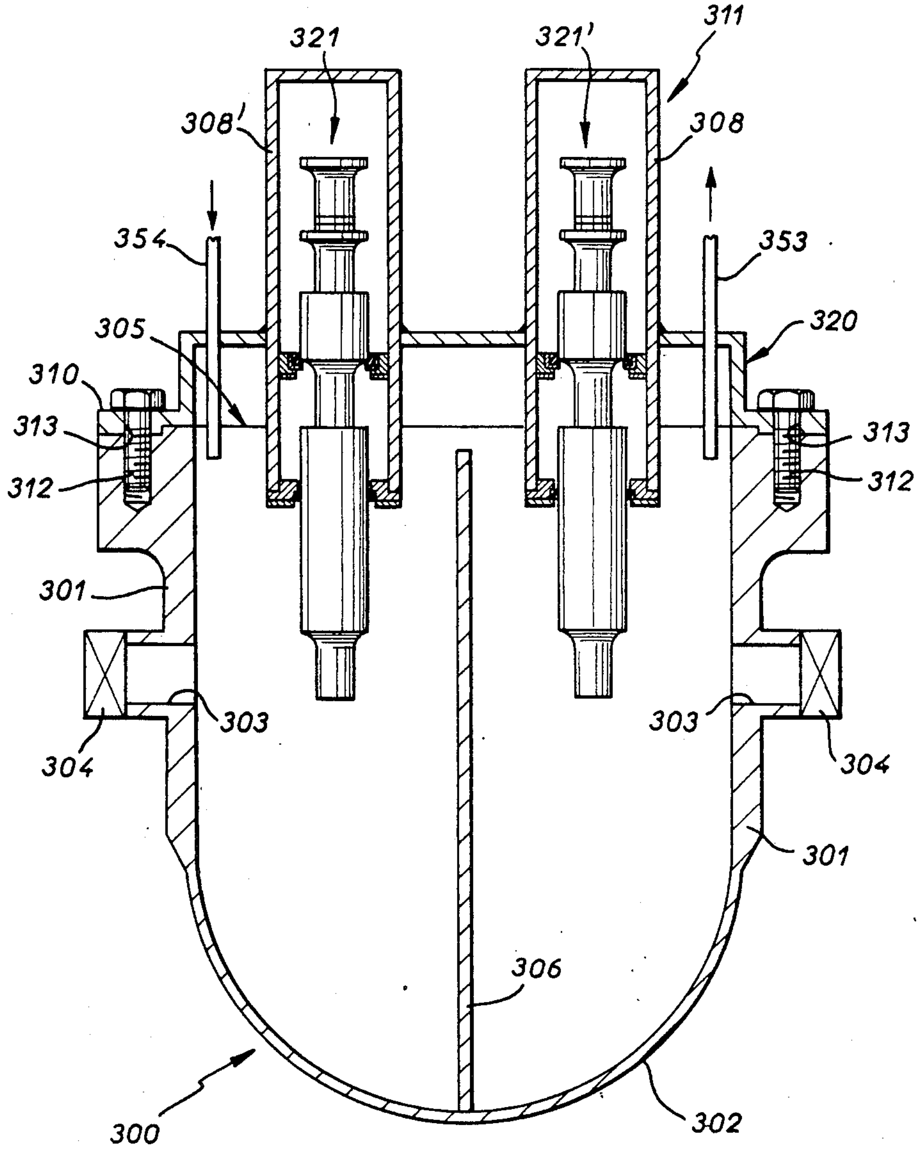
FIG. 7 shows the use of the cleaning apparatus and installation shown in FIGS. 4 through 6 in the case of a hollow body other than a valve.

FIG. 7 shows the application of the cleaning apparatus in accordance with the invention to a hollow object which is not a valve.

In this figure the hollow object to be cleaned is a tank 300 comprising a generally cylindrical part 301 and a generally hemispherical part 302 consituting the bottom of the tank. The tank comprises a number of side orifices 303 which may be shut off by valves 304. It comprises at its upper end a main orifice 305. In the example shown the interior of the tank 300 is divided into two chambers separated by an intermediate partition 306 lying in an axial plane.

The cleaning apparatus 311 comprises a support 320 adapted to close off the orifice 305 and to carry, in this example, two ultrasonic devices 321 and 321'.

These ultrasonic devices 321 and 321' are of similar structure to the device 11 described with reference to FIG. 1 and also function at a frequency of 20 kHz. In this case the devices 321, 321' are protected by a housing 308, 308' fastened to the support 320.

A set of cleaning liquid inlet conduits 353 and a set of cleaning liquid outlet conduits 354 are associated with the support 320, only one of the conduits 353 and 354 being shown in FIG. 7.

In this example the support 320 is adapted to be fixed to the tank 300 by an annular collar 310 comprising holes 313 regularly distributed along its periphery, a set of screws 312 fixing said support 320 to the tank 300.

The operation of the apparatus 311 is similar to that of the apparatus described with reference to FIGS. 4 through 6. After closing the valves 304 and fixing the support 320 over the orifice 305, the tank 33 is filled with cleaning liquid by connecting the conduits 353 and 354 to a cleaning liquid circuit such as that of FIG. 4. The transducers 321 and 321' are then energized by a generator (not shown in FIG. 7) and the interior of the tank is cleaned under vapor cavitation conditions.

There will now be described with reference to FIGS. 8 and 9 another aspect of the present invention, namely an apparatus for cleaning and decontaminating surfaces comprising one or more ultrasonic devices as described with reference to FIG. 1.

Figures 8, 9, 10:
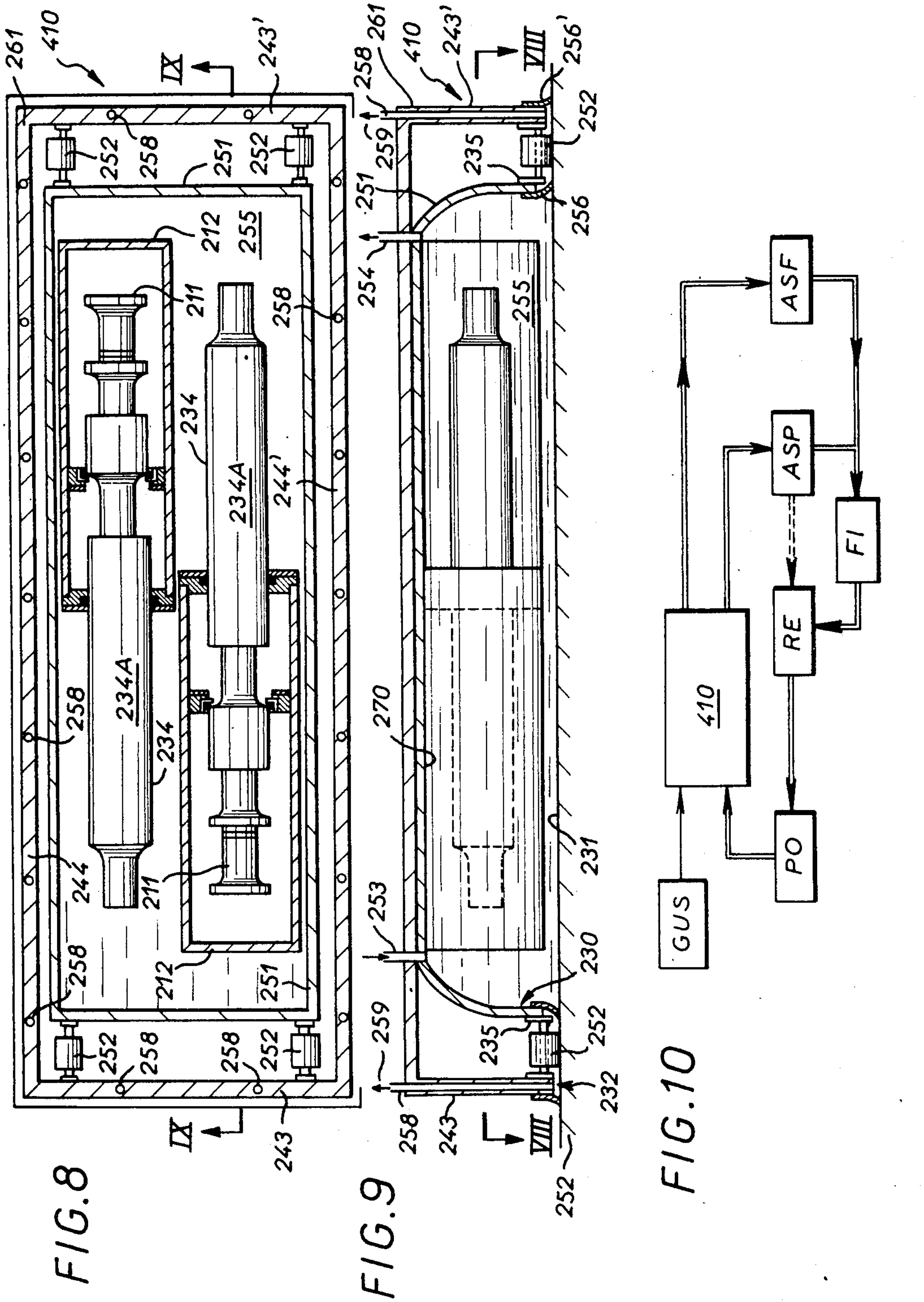
FIG. 8 is a schematic view in cross-section on the line VIII—VIII in FIG. 9 of apparatus in accordance with the present invention for cleaning surfaces.
FIG. 9 is a schematic view of this apparatus in cross-section on the line IX—IX in FIG. 8.
FIG. 10 is a block diagram showing the interconnection of the apparatus of FIGS. 8 and 9 with other components of a cleaning installation in accordance with the present invention.

In the embodiment described and shown in FIGS. 8 and 9, the cleaning apparatus 410 comprises a so-called "confinement" chamber 251 adapted to contain a volume of liquid and of generally parallelepipedal shape and a so-called "protective" enclosure, also of generally parallelepipedal shape, within which the confinement chamber 251 is disposed.

Two ultrasonic devices 211 mounted in their housing 212 are disposed inside the confinement chamber 251. The devices 211 and housing 212 are similar to the device 11 and the housing 12 described hereinabove. However, in these examples, the cavitators 234 have an axial length of five quarter-wavelengths ($5 \cdot \lambda/4$) and thus feature a radial action part 234A at which are located two peaks of radial vibrations.

The housings 212 are mounted on the upper wall 270 of the confinement chamber 251, so that the ultrasonic devices 211 are arranged in head-to-tail fashion. The confinement chamber 251 is connected to a cleaning liquid circuit, the conduit through which this liquid arrives at the chamber 251 being referenced 253 while the outlet conduit is referenced 254. These conduits pass through the upper walls of the chamber 251 and enclosure 261 and discharge into the interior 255 of the confinement enclosure 251.

The confinement enclosure 251 comprises, opposite the upper surface 270, an opening 230 designed to be directed towards the surface to be cleaned, the surface 231 in FIG. 9. The opening 230 thus occupies all the surface area opposite the upper surface 270. This opening 230 is fitted with a seal 256 disposed around this periphery. In this embodiment the seal 256 is of the "lip seal" type.

The confinement chamber 251 is fastened to the protective enclosure 261 by means of U-shaped lugs 235 which are fixed to the walls of the chamber and enclosure in an appropriate manner. These lugs 235 carry rollers 252 facilitating movement of the apparatus 410 over the surface 231 to be cleaned. A lip seal 256' is also disposed along the perimeter of an opening 232 in the protective enclosure 261 formed in substantially the same plane as the opening 230 in the confinement enclosure 251 and directed, in use, onto the surface 231 to be cleaned.

A device for drawing up leaks schematically represented in FIG. 8 by tubes 258 and arrows 259 is disposed in the walls of the protective enclosure 261, having an extension normal to the surface to be cleaned 231, the walls 243, 243', 244, 244' in FIGS. 8 and 9.

FIG. 10 shows one embodiment of an installation employing the apparatus 410. The latter is connected to an ultrasound generator GUS which feeds the ultrasonic devices 211.

Other elements of the electrical installation (power supply, for example, etc) are not shown in figure 10. The other connections of FIG. 5, which are schematically represented with a double line, represent the cleaning liquid circulation circuit. The installation comprises a pump PO for circulating this liquid, a liquid storage tank RE, a filter installation FI, a main suction device ASP and a leak suction device ASF.

The operation of the cleaning apparatus and of the typical installation employing this apparatus will now be described.

The apparatus is first placed in contact the surface 231 to be cleaned, so that the latter closes off the openings 230, 232 in the chamber and the enclosure. A double confinement volume is immediately created: on the one hand the interior volume of the confinement enclosure 251 which may then be filled with cleaning liquid, a certain degree of sealing being achieved by the seal 256, and on the other hand the inside volume of the protective enclosure 261, the lip seal 256' ensuring a seal at the junction between the enclosure 261 and the surface 231 to be cleaned.

Under the action of the pump PO, circulation of the liquid is established within the confinement enclosure 251. This cleaning liquid is taken off from the storage tank RE and discharged into this storage tank by the main suction system ASP after filtering it in the filter device FI.

The ultrasonic devices 211 create, due to the action of the ultrasound generator GUS, an ultrasound field the frequency of which is in this case aproximately 20 kHz, the generator frequency possibly being variable to provide for adjusting the excitation of the ceramic members of said ultrasonic devices, given the nature of the liquid medium, of course.

Cavities form and implode at a rate set by the ultrasound frequency, and those which implode in the vicinity of the surface 31 to be cleaned detach patches of deposited dirt adhering to this surface. The cleaning liquid polluted by these deposits of dirt is evacuated to the filter device FI and re-injected after flitering out of dirt particles in the filter device FI. If the surface 231 to be cleaned is not particularly dirty, it is possible to re-inject part of the polluted liquid directly into the reservoir RE, this facility being illustrated by a chain-dotted connection between the suction device ASP and the reservoir RE.

According to one aspect of the invention, leaks occurring towards the outside of the confinement chamber 251, in spite of the sealing device, in this instance the lip seal 256, are drawn up by the leak suction means schematically represented by the conduits 258 and the arrows 259 in FIGS. 8 and 9, by the device ASF of FIG. 10. By virtue of this arrangement it is possible to recover the cleaning liquid and to avoid excessive leakage of liquid to the outside of the apparatus 410.

This arrangement also makes it possible to clean relatively irregular surfaces, such as tiles, for example, for which it is very difficult to avoid leaks using conventional seals such as the lip seal 256. The majority of these leaks are drawn in by the device 258, 259 before reaching the second lip seal 256'.

Thus an installation of this kind may be successfully employed to clean surfaces which may have a vertical orientation and feature irregularities, such as, for example, the surfaces of tunnels, buildings or pools.

In this connection it will be noted that the implosion of the cavities makes it possible to decontaminate these surfaces, which makes the device in accordance with the invention as shown in FIGS. 8 and 9 particularly beneficial for cleaning nuclear reactor pools in nuclear power plants.

It will also be noted that the implosion of the cavities makes it possible to destroy all forms of life on the surface 231, which is particularly advantageous when cleaning floors contaminated by living organisms, such as hospital floors, for example.

It will be understood that various changes in the details, materials and arrangements of parts which have been herein described and illustrated in order to explain the nature of the invention may be made by those skilled in the art within the principle and scope of the invention as expressed in the appended claims.

We claim:

1. Ultrasonic device comprising at least one ultrasonic transducer and a probe having an active part adapted to be immersed in a medium, said active part including an adapter part having a surface for matching the impedance of said probe to the medium, said adapter part surface having an end face and said active part extending longitudinally between said end face of said adapter part and a limiting part beyond said active part, said probe being adapted to carry longitudinal ultrasonic waves and radial ultrasonic waves generated by said ultrasonic transducer, said limiting part being located at a node of the longitudinal ultrasonic waves and said end face being located at a peak of the longitudinal ultrasonic waves, the longitudinal dimension of said active part being such that in operation at least one peak of the radial ultrasonic waves will be formed along said active part intermediate said limiting part and said end face.

2. Device according to claim 1, wherein said limiting part is adapted to provide for fastening the device in position.

3. Device according to claim 1, wherein the longitudinal dimension of said first active part is an odd multiple of one quarter the wavelength of said ultrasonic waves having a value of at least three.

4. Device according to claim 1, enclosed in a protective housing and further comprising damper seals whereby said device is attached to said housing.

5. Device according to claim 1, enclosed in a protective housing and further comprising means whereby said device is attached to said housing interacting with a portion of said device at which is located a node of said longitudinal ultrasonic waves.

6. Device according to claim 1, enclosed in a protective housing and further comprising a damper seal whereby said device is attached to said housing and means for radially expanding said seal so that it is compressed against the inside surface of said housing.

7. Device according to claim 6, wherein said seal is an O-ring and said expanding means comprise two ring members.

8. Device according to claim 6, wherein said seal is compressed radially against said limiting part of said probe.

9. Apparatus for cleaning hollow objects which comprise a main orifice adapted to contain a liquid, said apparatus comprising a support adapted to carry at least one ultrasonic device comprising at least one ultrasonic transducer and a probe having an active part adapted to be immersed in a medium, said active part including an adapter part having a surface for matching the impedance of said probe to the medium, said adapter part surface having an end face and said active part extending longitudinally between said end face of said adapter part and a limiting part beyond said active part, said probe being adapted to carry longitudinal ultrasonic waves and radial ultrasonic waves generated by said ultrasonic transducer, said limiting part being located at a node of the longitudinal ultrasonic waves and said end face being located at a peak of the longitudinal ultrasonic waves, the longitudinal dimension of said active part being such that in operation at least one peak of the radial ultrasonic waves will be formed along said active part intermediate said limiting part and said end face, the arrangement being such that, in use, said active part of said device is immersed in said liquid contained in one of said objects.

10. Apparatus according to claim 9, further comprising liquid circulation means adapted to renew said liquid contained in said object.

11. Apparatus according to claim 9, further comprising means for closing off any secondary orifices in said object.

12. Apparatus according to claim 11, for cleaning objects having secondary orifices connected to pipes, wherein said means for closing off said secondary orifices comprise pneumatic buffers in the form of airbags adapted to be connected to a compressed air supply.

13. Apparatus for cleaning surfaces, comprising a chamber adapted to contain a liquid and having an opening adapted to be directed towards a surface to be cleaned and at least one ultrasonic device comprising at least one ultrasonic transducer and a probe having an active part adapted to be immersed in a medium, said active part including an adapter part having a surface for matching the impedance of said probe to the medium, said adapter part surface having an end face and said active part extending longitudinally between said end face of said adapter part and a limiting part beyond said active part, said probe being adapted to carry longitudinal ultrasonic waves and radial ultrasonic waves generated by said ultrasonic transducer, said limiting part being located at a node of the longitudinal ultrasonic waves and said end face being located at a peak of the longitudinal ultrasonic waves, the longitudinal dimension of said active part being such that in operation at least one peak of the radial ultrasonic waves will be formed along said active part intermediate said limiting part and said end face, the arrangement being such that, in use, said active part of said device is immersed in said liquid.

14. Apparatus according to claim 13, comprising two of said ultrasonic devices disposed in head-to-tail relationship in said chamber.

15. Apparatus according to claim 13, further comprising a protective enclosure surrounding said chamber.

16. Apparatus according to claim 15, further comprising a device associated with said protective enclosure for drawing off leaking liquid.

17. Cleaning installation comprising apparatus for cleaning hollow objects which comprise a main orifice and are adapted to contain a liquid, said apparatus comprising a support adapted to carry at least one ultrasonic device comprising at least one ultrasonic transducer and a probe having an active part adapted to be immersed in a medium, said active part including an adapter part having a surface for matching the impedance of said probe to the medium, said adapter part surface having an end face and said active part extending longitudinally between said end face of said adapter part and a limiting part beyond said active part, said probe being adapted to carry longitudinal ultrasonic waves and radial ultrasonic waves generated by said ultrasonic transducer, said limiting part being located at a node of the longitudinal ultrasonic waves and said end face being located at a peak of the longitudinal ultrasonic waves, the longitudinal dimension of said active part being such that in operation at least one peak of the radial ultrasonic waves will be formed along said active part intermediate said limiting part and said end face, the arrangement being such that, in use, said active part of said device is immersed in said liquid contained in one of said objects.

18. Cleaning installation comprising apparatus for cleaning surfaces comprising a chamber adapted to contain a liquid and having an opening, adapted to be directed towards a surface to be cleaned and at least one ultrasonic device comprising at least one ultrasonic transducer and a probe having an active part adapted to be immersed in a medium, said active part including an adapter part having a surface for matching the impedance of said probe to the medium, said adapter part surface having an end face and said active part extending longitudinally between said end face of said adapter part and a limiting part beyond said active part, said probe being adapted to carry longitudinal ultrasonic waves and radial ultrasonic waves generated by said ultrasonic transducer, said limiting part being located at a node of the longitudinal ultrasonic waves and said end face being located at a peak of the longitudinal ultrasonic waves, the longitudinal dimension of said active part being such that in operation at least one peak of the radial ultrasonic waves will be formed along said active part intermediate said limiting part and said end face, the arrangement being such that, in use, said active part of said device is immersed in said liquid.

* * * * *